United States Patent
Eriksson et al.

(10) Patent No.: US 6,297,645 B1
(45) Date of Patent: Oct. 2, 2001

(54) DEVICE FOR SENSING PARTIAL DISCHARGES IN TEST OBJECTS, PREFERABLY A CABLE JOINT

(75) Inventors: Thomas Eriksson, Uppsala; Kenneth Johansson, Västerås, both of (SE)

(73) Assignee: ABB Research Ltd., Vasteras (SE)

( * ) Notice: Subject to any disclaimer, the term of this patent is extended or adjusted under 35 U.S.C. 154(b) by 0 days.

(21) Appl. No.: 09/367,102

(22) PCT Filed: Mar. 9, 1998

(86) PCT No.: PCT/SE98/00410

§ 371 Date: Apr. 11, 1999

§ 102(e) Date: Nov. 4, 1999

(87) PCT Pub. No.: WO98/40756

PCT Pub. Date: Sep. 17, 1998

(30) Foreign Application Priority Data

Mar. 10, 1997 (SE) .................................. 9700836

(51) Int. Cl.⁷ .................................................. H01H 31/12
(52) U.S. Cl. .................................... 324/551; 324/536
(58) Field of Search .......................... 324/536, 522, 324/509, 524, 52, 76, 529, 547, 541, 534, 54, 551, 531, 537, 543; 428/76; 375/14; 323/208; 363/37

(56) References Cited

U.S. PATENT DOCUMENTS

| | | | |
|---|---|---|---|
| 4,288,872 | * 9/1981 | Tamburelli | 375/14 |
| 4,338,561 | * 7/1982 | Zaengl et al. | 323/208 |
| 4,446,420 | 5/1984 | Drouet . | |
| 4,967,158 | * 10/1990 | Gonzalez | 324/536 |
| 5,475,312 | 12/1995 | Sedding et al. . | |
| 5,481,195 | * 1/1996 | Meyer | 324/534 |
| 5,726,576 | * 3/1998 | Miyata et al. | 324/536 |
| 5,815,391 | * 9/1998 | Pelly | 363/98 |
| 5,903,158 | * 5/1999 | Eriksson et al. | 324/536 |
| 5,933,012 | 8/1999 | Bengtsson et al. . | |

FOREIGN PATENT DOCUMENTS

| | | |
|---|---|---|
| 56-82464 | 7/1981 | (JP) . |
| 4-235360 | 8/1992 | (JP) . |
| 6-3404 | 1/1994 | (JP) . |

* cited by examiner

*Primary Examiner*—Safet Metjahic
*Assistant Examiner*—E P LeRoux
(74) *Attorney, Agent, or Firm*—Connolly Bove Lodge & Hutz

(57) ABSTRACT

A device for sensing discharges in a test object (1) with two electric connection conductors (1a, 1b, 1c, 1d), preferably a cable joint, comprises at least one first and one second sensor (2a, 2b) and evaluation equipment (EVU). Each one of the sensors generates and supplies to the evaluation equipment sensor signals in dependence on current pulses through the connection conductors and the direction thereof, the first sensor a first sensor signal (v1) and the second sensor a second sensor signal (v2). The evaluation equipment generates in dependence on received sensor signals an indication signal (IND), indicating a partial discharge in the test object. The device comprises a first tuning unit (T1) associated with the first sensor and a second tuning unit (T2) associated with the second sensor, each unit, in dependence on the respective sensor signal, forming a first filter signal (SF1) and a second filter signal (SF2), respectively, periodically oscillating with a preselected period (TP), as well as a multiplying member (MU), which is supplied with, and in dependence on said filter signals, forms a product signal (SP), whereby the evaluation equipment forms the indication signal in dependence on the product signal.

11 Claims, 14 Drawing Sheets

US 6,297,645 B1

DEVICE FOR SENSING PARTIAL DISCHARGES IN TEST OBJECTS, PREFERABLY A CABLE JOINT

TECHNICAL FIELD

The present invention relates to a device according to the preamble to claim 1 for sensing electric discharges in a test object, preferably a cable joint.

BACKGROUND ART

The occurrence of local electric discharges, so-called partial discharges, in the insulation system for electric installation components or electric high-voltage apparatus, such as, for example, transformers, generators, cables, etc., constitute an important parameter for estimating the quality, condition and expected service life of the installation component. Normally, therefore, the acceptance tests for components for an electric high-voltage installation comprise a testing with respect to the occurrence of partial discharges under well defined conditions, for example according to IEC Publ. 270 "Partial Discharge Measurements". In addition thereto, various methods and devices have been developed for testing at the installation site for the purpose of assessing, after a certain time of operation, the condition of components and hence, for example, creating a more reliable basis for a decision on preventive maintenance.

One problem when measuring partial discharges is to distinguish measurement signals originating from partial discharges in the test object from disturbances originating from partial discharges in surrounding installation components or in the testing equipment, or which have some other origin but a frequency and amplitude spectrum which resembles the spectrum of the partial discharges. Such disturbances may be passed to the test object through the connection leads, or conductors, by which it is galvanically connected to the surroundings but may also, in the relevant frequency ranges, be captured by the measuring device through electromagnetic radiation from the surroundings.

A partial discharge in an installation component gives rise to current pulses through the conductors by which the component is connected to the surroundings and these current pulses may be sensed either by measuring the voltage caused thereby when they pass through a measuring impedance connected to one of the conductors, or by a direct or indirect current measurement. During voltage measurement, the measuring equipment comprises a coupling capacitor, which must be free from partial discharges under the conditions under which the measurement is carried out, and the test object, the coupling capacitor and the measuring impedance are galvanically interconnected, in a manner known per se, and connected to the surrounding installation components and to the test equipment, respectively.

When sensing the partial discharge through current measurement, sensors are required which are sensitive to the magnetic field associated with the current pulse. The measurement signal obtained from such sensors may be kept galvanically separated from the test object and the high-voltage circuit connected thereto, in which case, among other things, problems such as the effect of loops in the ground circuits is eliminated. Current-measuring sensors eliminate the need of coupling capacitors and measuring impedances and may be designed with very small dimensions, which makes it simple to arrange them at installation components of varying dimensions and shapes.

The unpublished international patent application PCT/SE96/01126 describes a device for sensing electric discharges in a test object with at least two electric connection leads, comprising evaluation equipment and two sensors, each one for direction-sensitive sensing of current pulses through a respective one of the connection leads. The sensors, for example in the form of Rogowski coils, sense a magnetic field, generated by the current pulses, and the polarity of this magnetic field, and produce, in dependence on these current pulses and their direction, one sensor signal each to the evaluation equipment. This equipment generates, in dependence on received sensor signals, an indication signal, indicating an electric discharge in the test object, when the sensor equipment senses current pulses which essentially simultaneously flow either in a direction out from the test object through all the connection leads or in a direction into the test object through all the connection leads. The evaluation equipment comprises means which form a sum signal in dependence on a sum of sensor signals originating from sensors associated with mutually separated connection leads, and a difference signal in dependence on a difference of sensor signals originating from sensors associated with mutually separated connection leads. A comparing member comprised in the evaluation equipment forms a comparison signal in dependence on the sum signal and the difference signal, for example as a quotient between these signals, whereby the indication signal is formed in dependence on the comparison signal.

The device comprises a filter unit, associated with each sensor and placed in the vicinity thereof, for tuning the natural frequency of the sensor, with a tuning circuit in the form of a resistor connected in parallel with a capacitor, and a bandpass filter for tuning to the series-resonance frequency of the test object.

Because of the physical distance between two sensors, placed on different sides of the connection leads of the test object, when an external disturbance passes through the connection leads of the test object, the sensors will generate their respective sensor signals at different times, that is, the physical distance between the sensors corresponds to a time distance between the sensor signals which emanate from the disturbance. This time distance may under certain circumstances, especially in test objects which because of their shapes only allow a location of sensors with a large mutual physical distance, by the method described in the patent specification involving addition and summation of sensor signals, lead to reduced reliability in the detection of external disturbances as opposed to internal discharges.

It has also been found that, in certain embodiments, the sensors, when they are subjected to a compressive force when being mounted on the test object, may exhibit an inductance which deviates from its nominal value. This fact, as well as, of course, manufacturing tolerances for the sensor, leads to the tuning circuit causing a mistuning of the sensor. This results in a deteriorated signal/noise ratio in the signal which is to be further processed in the evaluation equipment, which in turn requires adjustment of the tuning of the sensor by means of adjusting members provided for this purpose.

SUMMARY OF THE INVENTION

The object of the invention is to provide a device of the kind stated in the introduction, which allows a simple, safe and reliable distinction between, on the one hand, partial discharges in a predetermined installation component and, on the other hand, external disturbances and partial discharges in connected installation components or test equipment, in order, particularly for those cases where the physical distance between the sensors is large, to be able to carry out a safe and reliable location of a possible partial discharge at the predetermined installation component.

What characterizes a device according to the invention will become clear from the appended claims.

Advantageous improvements of the invention will become clear from the following description and claims.

BRIEF DESCRIPTION OF THE DRAWINGS

The invention will be explained in more detail by description of embodiments with reference to the accompanying drawings, wherein.

DESCRIPTION OF THE PREFERRED EMBODIMENTS

Figure 1A:
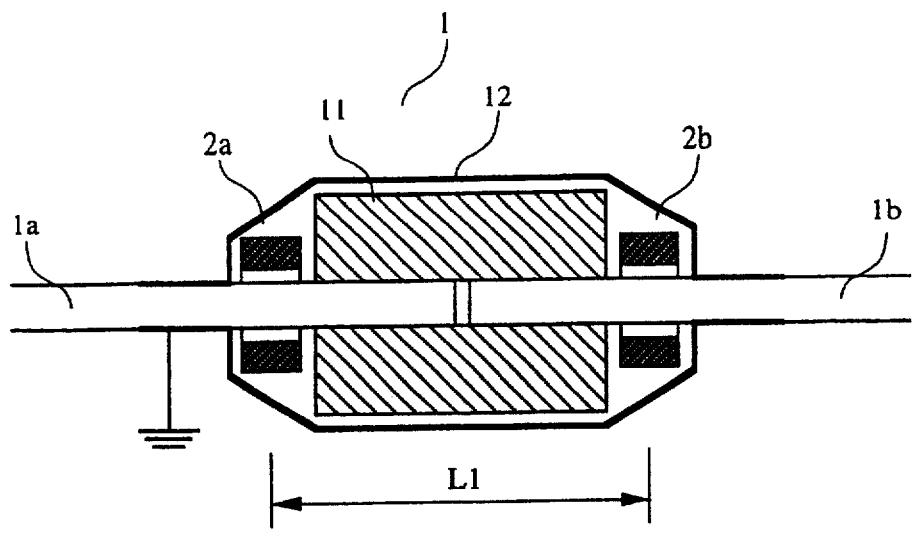
FIGS. 1A–1B show, in schematic longitudinal section, a test object in the form of an electric cable joint.

FIG. 1a shows, in schematic longitudinal section, a test object 1 in the form of an electric cable joint. The cable joint comprises two cable ends 1a, 1b, each one constituting part of an electric cable. In a manner known per se, the cable ends are joined to each other and the joint comprises a sleeve 11 and a grounded shield 12, the joint surrounding the sleeve and parts of the cable ends. The cable ends constitute electric connection leads to the test object. A first and a second sensor 2a and 2b, respectively, are placed inside the shield on one side each of the sleeve. The figure illustrates a case where the shield is separated from the sleeve, in which case it is advantageous to arrange the sensors at the cable ends, viewed in the longitudinal direction of the cable between the sleeve and the shield. The first and second sensors are located at a first mutual distance L1. The sensors are of a kind known per se which makes possible direction-sensitive sensing of current pulses through the connection leads by sensing of a magnetic field generated by the current pulses. In this embodiment, the sensors are in the form of Rogowski coils, in the figure schematically shown in cross section and each surrounding one of the connection leads. By a Rogowski coil is meant in this context a coil arranged in such a way in an electric conductor that the axis of the coil is directed at least substantially in the same direction as the field lines in the magnetic field generated by an electric current in the conductor around this.

Each one of the sensors generates a sensor signal in dependence on the above-mentioned current pulses and their direction, the first sensor a first sensor signal v1 and the second sensor a second sensor signal v2.

Figure 2A:
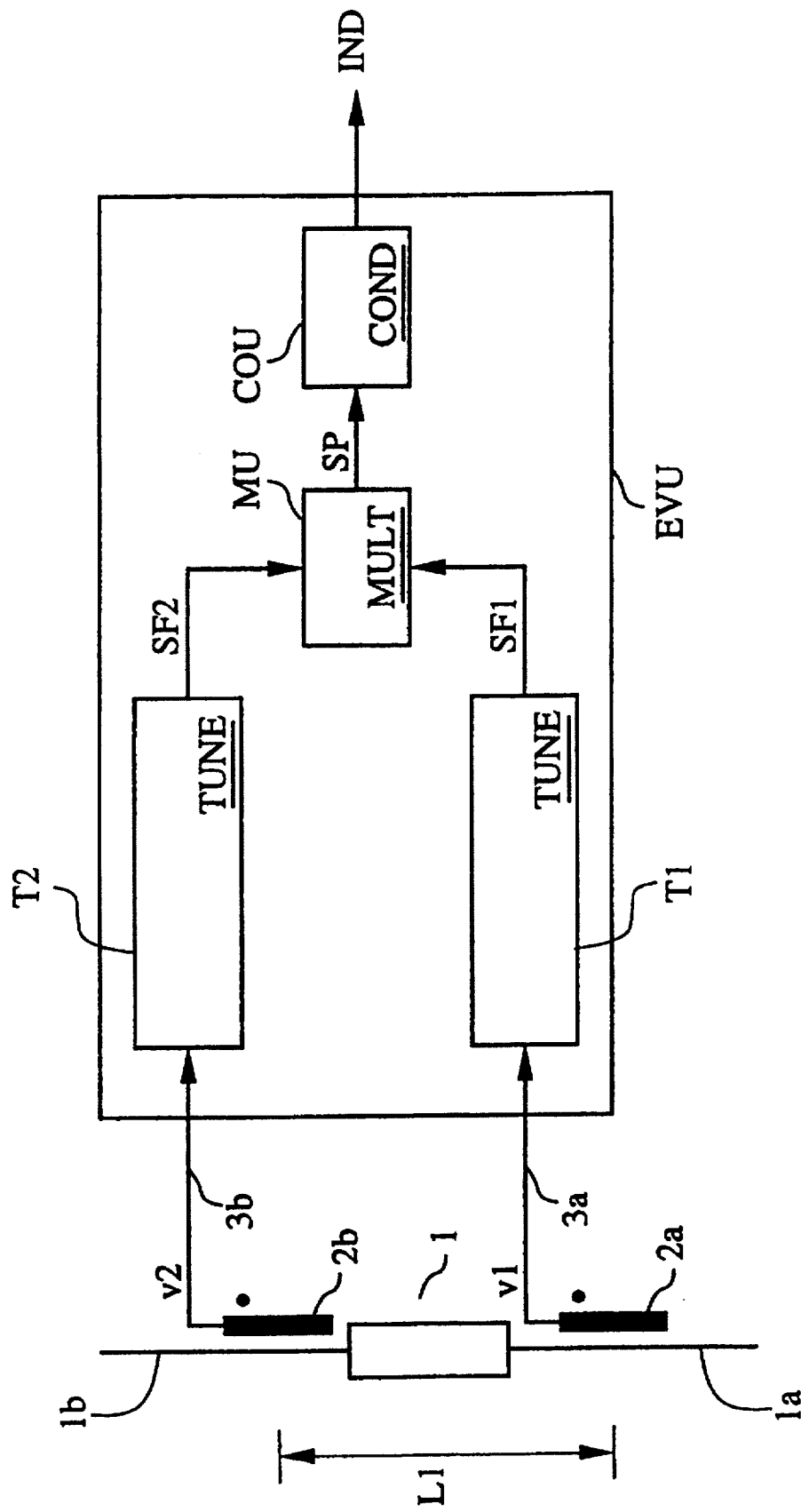
FIGS. 2A–2C show, in the form of a schematic block diagram, various embodiments of the invention.

FIG. 2A shows in the form of a schematic block diagram an embodiment of the invention. The figure shows the test object 1 with the connection leads 1a, 1b, the sensors 2a, 2b and evaluation equipment EVU which will be described in greater detail below. The evaluation equipment comprises a first tuning unit, T1 associated with the first sensor, and a tuning unit T2, associated with the second sensor, of the same kind as the first tuning unit, a multiplying member MU and a signal-processing unit COU.

The sensors are so arranged that voltages of the same polarity are generated at the taps of the coils which are marked by a dot in the figure, when current pulses flow through the connection leads in a direction such that they pass through the coils from the end of the coils which is marked by a dot to the unmarked end thereof. For the sake of clarity, FIG. 2A shows the coils as elongated coils along the respective connection lead.

The first tuning unit is supplied with the first sensor signal v1 via a two-wire sensor cable 3a and forms, in dependence on this signal, a first filter signal SF1. The second tuning unit is supplied with the second sensor signal v2 via a two-wire sensor cable 3b and forms, in dependence this signal, a second filter signal SF2. The multiplying member is supplied with the filter signals and forms, in dependence thereon, a product signal SP which is supplied to the signal-processing unit. The signal-processing unit forms the indication signal IND in dependence on the product signal.

The test object is connected to an electric circuit (not shown) in an electric installation and is energized with power frequency during operation, that is generally 50 Hz or 60 Hz.

An electric discharge, that is, a partial discharge, in the insulation system of a test object or an installation component gives rise to a current pulse which, by current ramification, is distributed in the circuits of the installation and hence also through the connection leads of the test object. If such a discharge occurs in an installation component outside the test object, the current pulse associated therewith through the connection leads of the test object, depending on the polarity of the discharge, will pass either into the test object through the connection lead 1a and out therefrom through the connection lead 1b, or vice versa. Generally, the test object exhibits an impedance, which in the frequency range relevant to the sensing of current pulses, damps the amplitude of and/or phase-shifts currents which pass through the test object via its connection leads. The distance L1 between the sensors thus results in the first and second sensor signals appearing at a mutual first time distance $\Delta T1'$.

If, on the other hand, such a discharge occurs in the test object, the discharge will generate current pulse associated therewith, which flow through the two connection leads, either in a direction away from the test object or in a direction towards the test object. Whether the current direction is away from or towards the test object is determined by the polarity of the discharge. Current pulses originating from one and the same discharge will thus give rise to sensor signals with a mutual time distance which is dependent on where within the test object the discharge occurs; however, the time distance does not exceed the above-mentioned first time distance $\Delta T1'$.

Figure 3A:
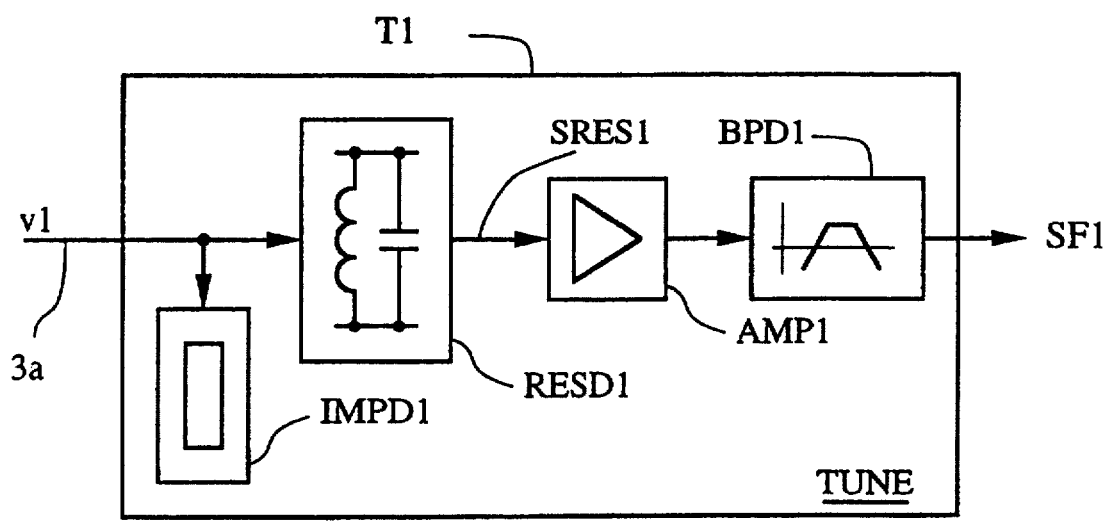
FIG. 3A shows, in the form of a schematic block diagram, an embodiment of a tuning unit according to the invention.

FIG. 3A shows, in the form of a schematic block diagram, an embodiment according to the invention of the first tuning unit T1. It comprises an impedance matching member IMPD1, connected to the sensor cable 3a, a resonant circuit RESD1, an amplification member AMP1 and a band-pass-filtering member BPD1. The first sensor signal is supplied to the resonant circuit, the output SRES1 of which is supplied to the amplification member AMP. The output signal therefrom is supplied to the bandpass-filtering member which, in dependence on supplied signals, forms the first filter signal SF1. The second tuning unit T2 is of the same kind as the first tuning unit and comprises an impedance matching member IMPD2, connected to the sensor cable 3b, a resonant circuit RESD2, which forms an output signal SRES2, an amplification member AMP2 and a bandpass-filtering member BPD2 which forms the second filter signal SF2.

The impedance matching member exhibits an impedance equal to the characteristic impedance of the sensor cable and hence makes possible a reflection-free termination of the sensor cable.

The resonant circuit and the bandpass-filtering member BPD are tuned to parallel resonance at, or comprise in their passband, an angular frequency $\omega$ related to the first time distance $\Delta T1'$, so chosen that its period TP is much longer than this time distance $\Delta T1'$. The time distance $\Delta T1'$ is typically of the order of magnitude of hundreds of microseconds and the angular frequency $\omega$ is chosen, determined by factors such as the occurrence of any disturbances of certain frequencies, the inductance of the sensors and the expected frequency contents in the sensor signals, preferably corresponding to a frequency in an interval 10 kHz to 10 MHz. In a preferred embodiment, the resonant frequency comprises a parallel connection of an inductive and a capacitive impedance element. Further, it is assumed that the resonant circuit is designed with a decay time TD which is much longer than the first time delay $\Delta T1$, typically corresponding to at least two or three periods TP.

FIGS. 5A, 5B, 5E, 5F, 5G, 5H and 5J show on the vertical axis, sequentially on the respective axes, schematically the fundamental appearance of signal shapes for the above-mentioned sensor signals v1 and v2, the output signals SRES1, SRES2 from the resonant circuits RESD1 and RESD2, respectively, the filter signals SF1 and SF2 and the product signal SP, as a function of time, shown along the horizontal axis. The figures relate to the case where a partial discharge occurs in the test object between the sensors.

Figure 5A:
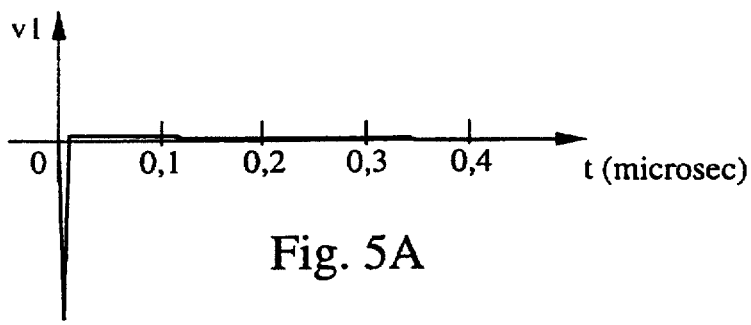
Figure 5B:
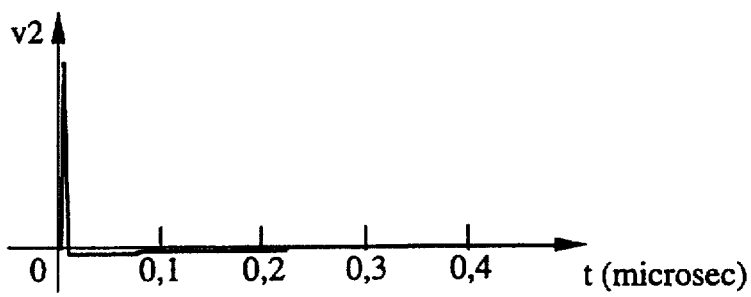
Figure 5C:
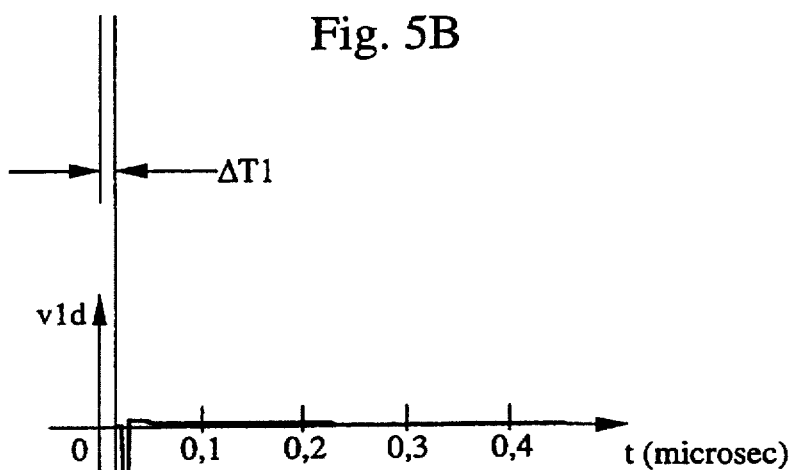
Figure 5D:
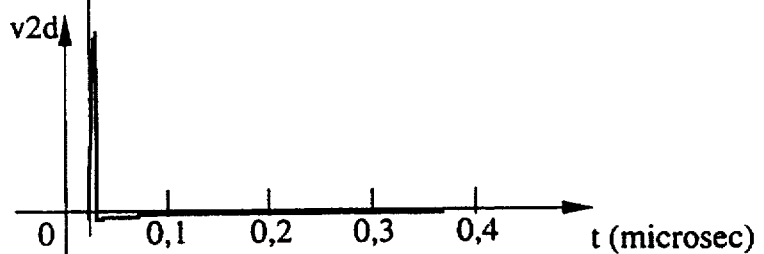
Figure 5E:
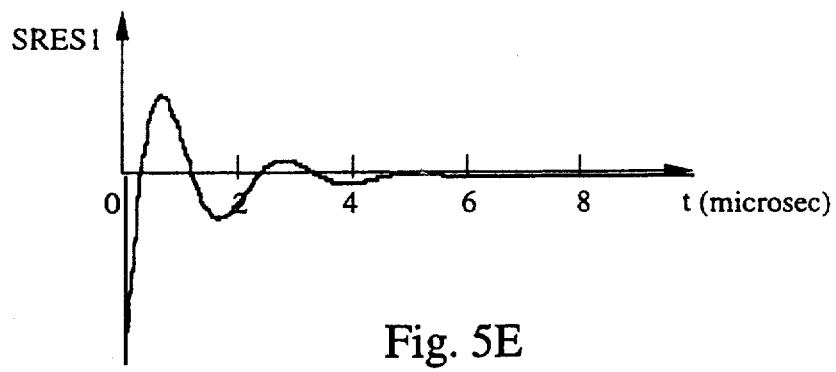
Figure 5F:
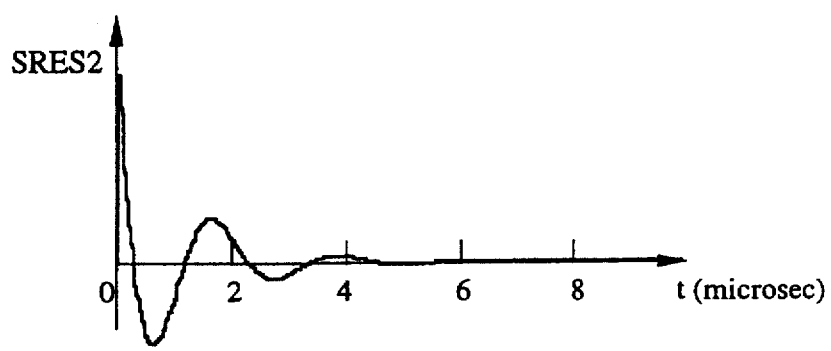
Figure 5G:
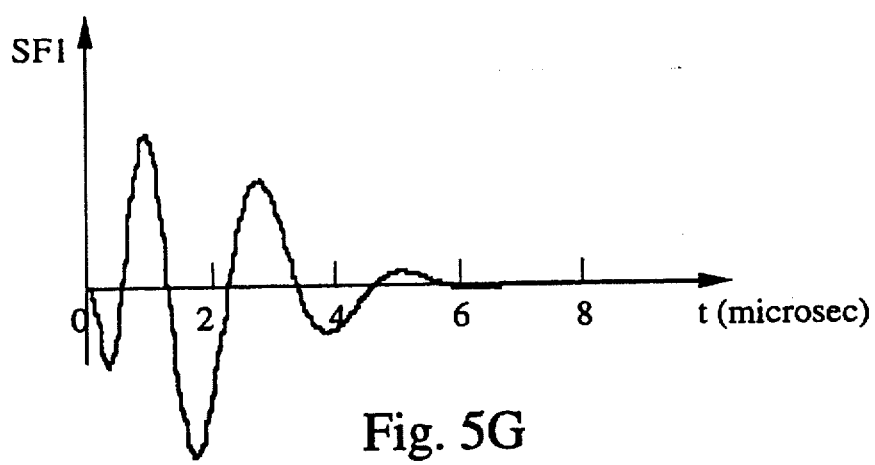
Figure 5H:
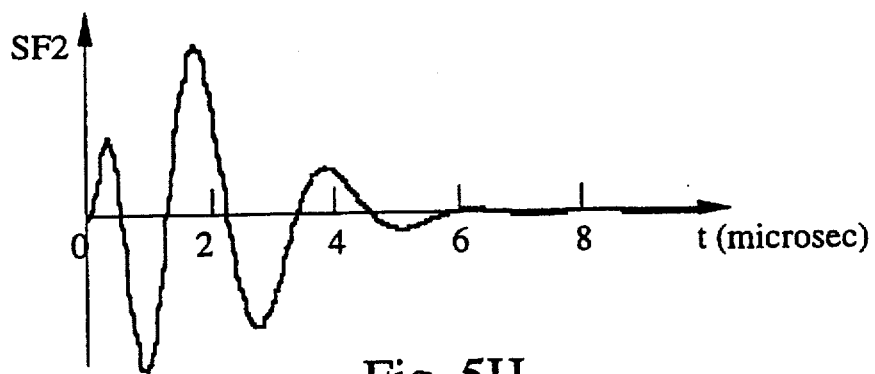
Figure 5J:
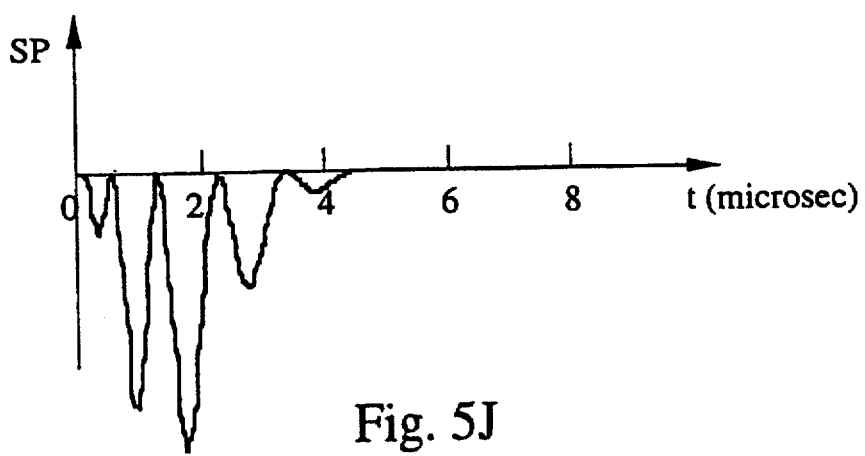

FIGS. 5A and 5B illustrate that the sensor signals in this case have the opposite polarity, each one generating an output signal from the respective resonant circuits as shown in FIGS. 5E and 5F, respectively. After bandpass-filtering, the first and second filter signals SF1 and SF2, respectively, will have a variation as shown in FIGS. 5G and 5H, respectively. The product signal is given an appearance as illustrated in FIG. 5J, that is, with the polarities shown in the figures, a pulsating variation with negative polarity.

Figure 6E:
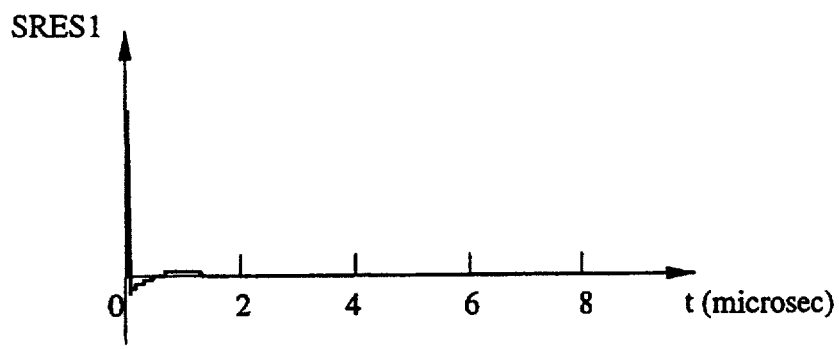
Figure 6F:
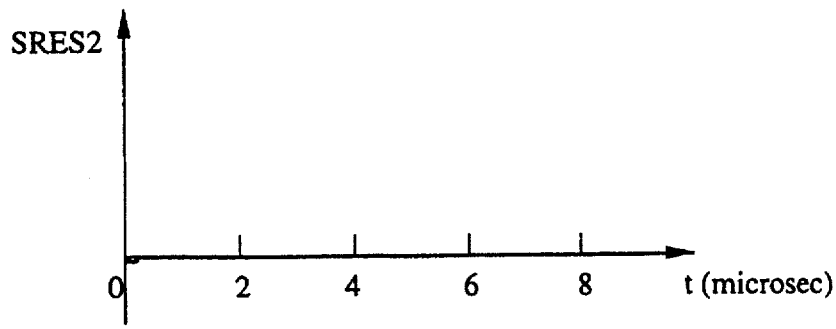
Figure 6A:
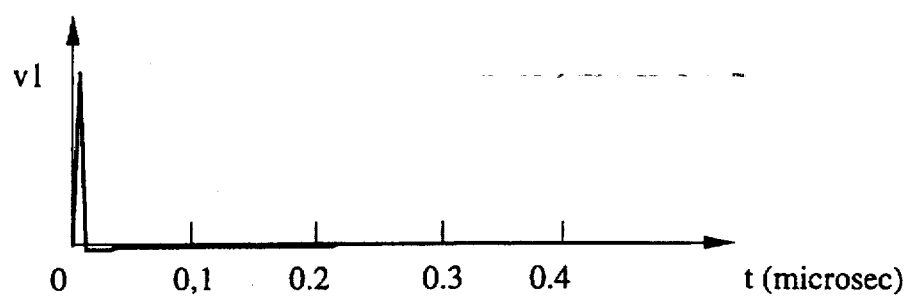
Figure 6B:
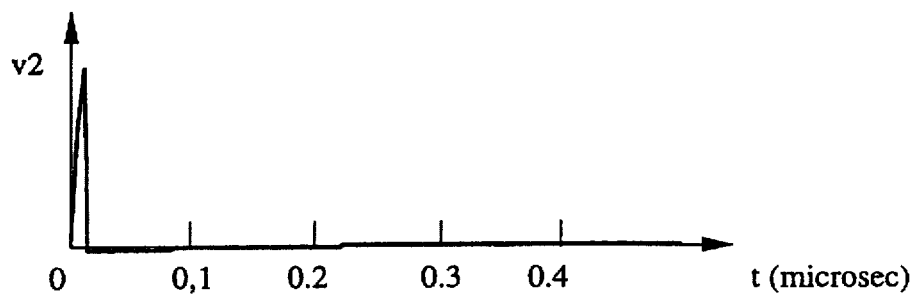

FIGS. 6A, 6B show on the vertical axis, sequentially on the respective axes, schematically the fundamental appearance of signal shapes for the sensor signals v1 and v2 as a function of time, shown along the horizontal axis. The figures relate to the case where an external disturbance, for example a current pulse originating from a partial discharge in an installation component connected to the test object, passes therethrough.

FIGS. 6A and 6B illustrate that the sensor signals in this case will have the same polarity, which implies that, with the polarities shown in the figures, the output signal SRES1 shown in FIG. 5E in this case will have a reversed polarity in relation to that shown in the figure. The corresponding case applies to the first filter signal SF1, and therefore, in this case, the product signal SP will have a pulsating variation with a positive polarity.

The indication unit may advantageously be designed in a manner known per se comprising a peak-value detector, which senses the peak value of the product signal and forms the indication signal in dependence on this peak value. Alternatively, the indication unit may be designed as a low-pass filtering member with a time constant adapted to the resonant frequency of the resonant circuits and form the indication signal in dependence on the output signal from this low-pass filtering member. The indication signal is supplied to equipment (not shown in the figure) for further evaluation by some method known to the person skilled in the art, for example comparison with a comparison signal.

Figure 2B:
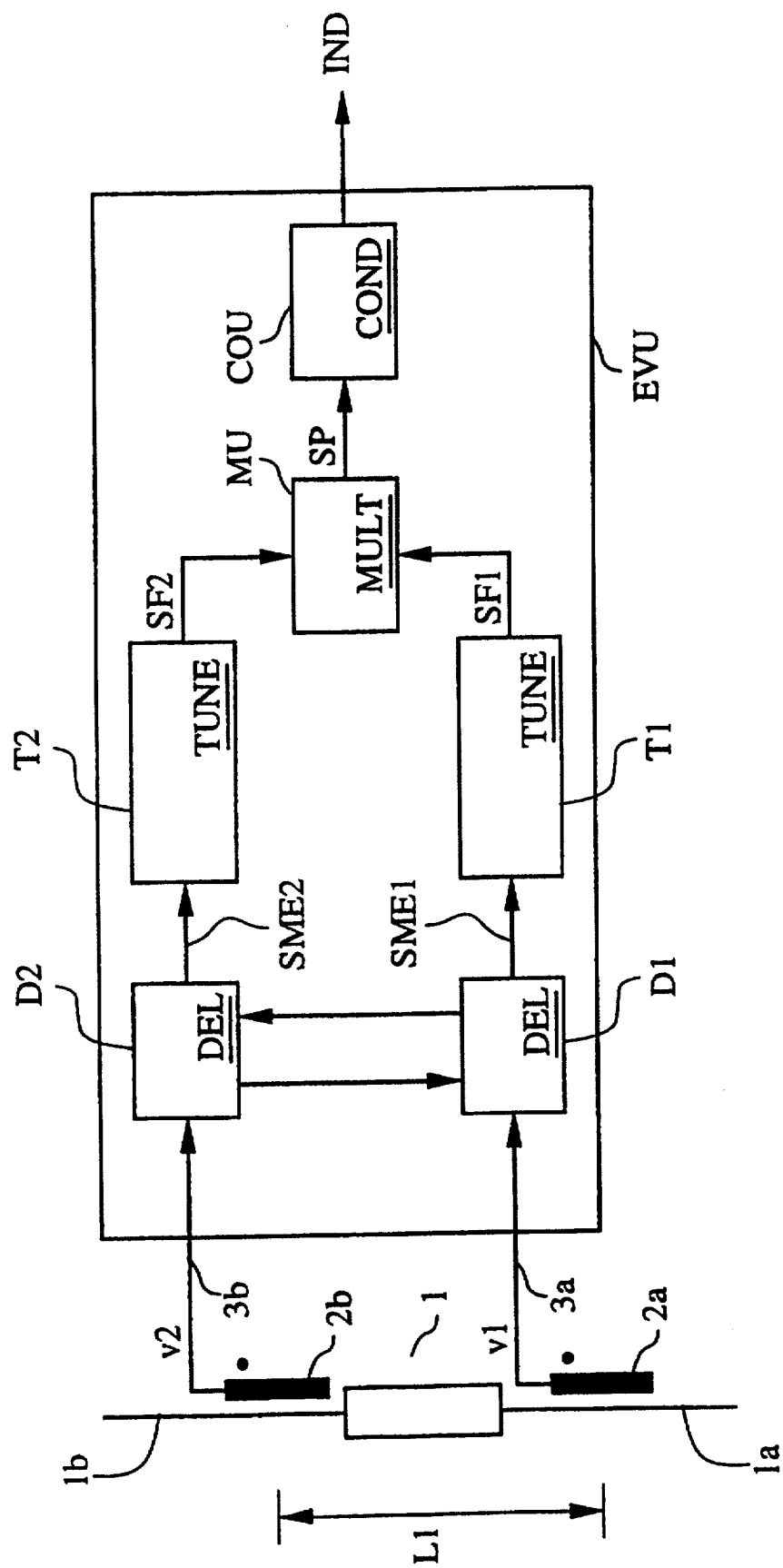

FIG. 2B shows an improvement of the invention which has proved to be particularly advantageous with respect to the suppression of external disturbances. It differs from the embodiment described with reference to FIG. 2A in that the evaluation equipment comprises a first delay unit D1, associated with the first sensor, and a second delay unit D2, associated with the second sensor. The first delay unit is supplied with the first sensor signal and with a second delayed sensor signal v2d, which will be described in greater detail below. The second delay unit is supplied with the second sensor signal and with a first delayed sensor signal v1d, which will be described in greater detail below. The first delay unit forms as output signal a first measurement signal SME1 and the first delayed sensor signal and the second delay unit form as output signal a second measurement signal SME2 and the second delayed sensor signal. The first tuning unit is supplied with the first measurement signal and forms the first filter signal in dependence thereon and the second tuning unit is supplied with the second measurement signal and forms the second filter signal in dependence thereon.

Figure 3B:
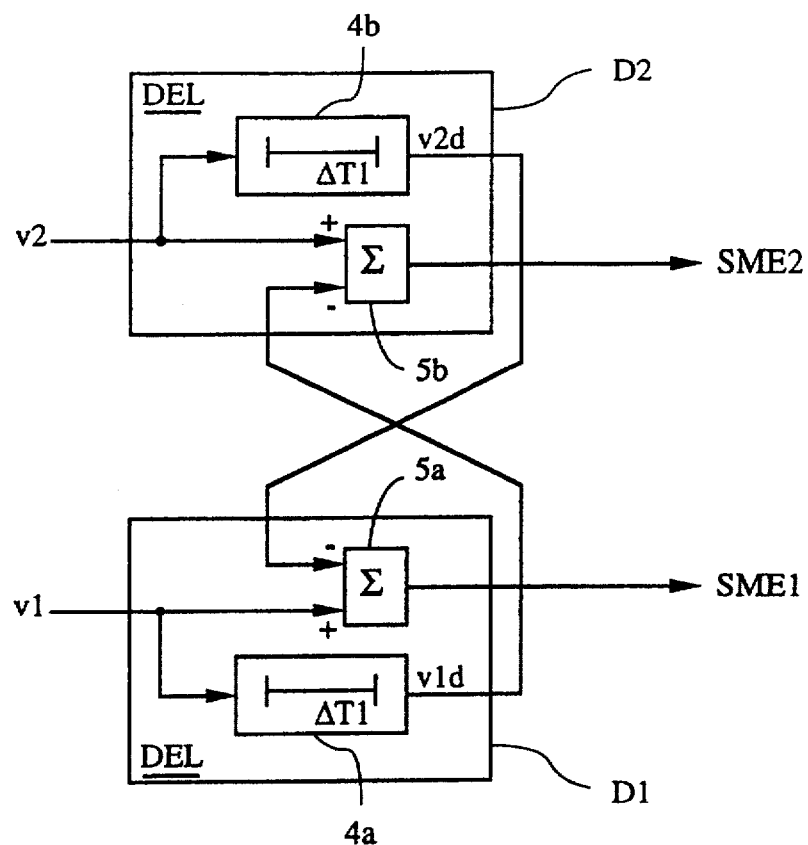
FIGS. 3B–3C shows, in the form of schematic block diagrams, various embodiments of delay units according to the invention, FIGS. 4A–4B schematically show parts of a circuit diagram for embodiments of a tuning unit according to the invention, FIGS. 5A–5H and 5J schematically show the fundamental appearance of signal shapes in case of an external disturbance and in case of a partial discharge in the test object, respectively, in an embodiment of the invention according to FIG. 2A, FIGS. 6A–6F schematically show the fundamental appearance of signal shapes in case of an external disturbance and in case of a partial discharge in the test object, respectively, in an embodiment of the invention according to FIG. 2B, and FIGS. 7A–7B schematically show the fundamental appearance of signal shapes in case of an external disturbance and in case of a partial discharge in the test object, respectively, in an embodiment of the invention according to FIG. 2C

FIG. 3B shows an embodiment of the first and second delay units. The first delay unit comprises a delay member 4a and a difference-forming member 5a, which are both supplied with the first sensor signal v1. The delay member forms as output signal the first delayed sensor signal v1d, which corresponds to the first sensor signal but delayed by an optional first time delay $\Delta T1$, preferably equal to the above-mentioned first time distance $\Delta T1'$.

The second delay unit comprises a delay member 4b and a difference-forming member 5b, which are both supplied with the second sensor signal v2. The delay member 4b forms as output signal the second delayed sensor signal v2d, which corresponds to the second sensor signal but delayed by the optional first time delay.

The difference-forming member 5a is also supplied with the delayed second sensor signal v2d and forms as output signal the first measurement signal in dependence on the difference of the first sensor signal and the second delayed sensor signal. The difference-forming member 5b is also supplied with the delayed first sensor signal v1d and forms as output signal the second measurement signal in dependence on the difference of the first sensor signal and the first delayed sensor signal.

The tuning units T1 and T2 in this embodiment may advantageously be of the kind described with reference to FIG. 3A.

FIGS. 5A–5H and 5J show on the vertical axis, sequentially on the respective axes, schematically the fundamental appearance of signal shapes for the sensor signals v1 and v2, for the above-mentioned delayed sensor signals v1$d$ and v2$d$, the output signals SRES1, SRES2 from the resonant circuits RESD1 and RESD2, respectively, the filter signals SF1 and SF2 and the product signal SP, as a function of time, shown along the horizontal axis. The figures relate to the case where a partial discharge occurs in the test object between the sensors. Further, it is assumed that the first time delay $\Delta T1$ is chosen equal to the first time distance $\Delta T1'$.

As will be clear from FIGS. 5A–5D, in this case the first measurement signal SME1 will comprise the first sensor signal v1 and, delayed by the first time delay $\Delta T1$ and the with reversed polarity, the second sensor signal v2. The corresponding reasoning applies to the second measurement signal SME2. Since the first time delay is much smaller than the period for the resonant frequencies of the resonant circuits, the output signals SRES1, SRES2 from the resonant circuits RESD1 and RESD2, respectively, the filter signals SF1 and SF2, the product signal SP will practically have the appearance as illustrated in FIGS. 5E–5H and 5J.

Figure 6C:
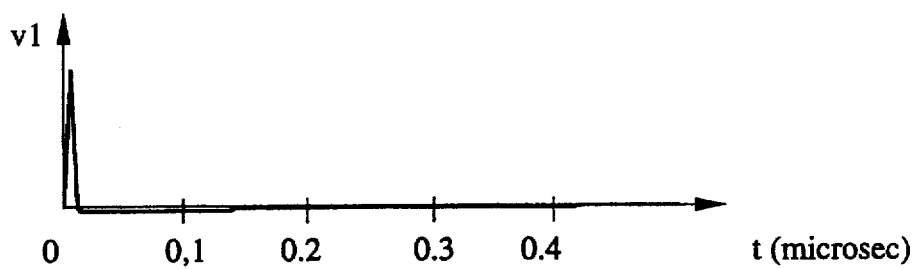
Figure 6D:
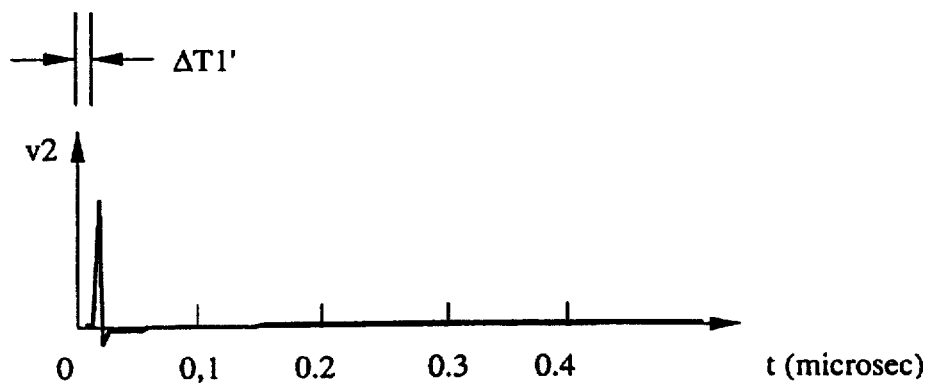

FIGS. 6C–6F show on the vertical axis, sequentially from top to bottom on the respective axes, schematically the fundamental appearance of signal shapes for the abovementioned sensor signals v1 and v2 and the output signals SRES1, SRES2 from the resonant circuits RESD1 and RESD2, respectively, as a function of time, shown along the horizontal axis. The figures relate to the case where an external disturbance, for example a partial discharge in an installation component connected to the test object, passes through this in a direction from the connection lead 1$a$ to the connection lead 1$b$ such that, as illustrated in FIGS. 6C–6D, the second sensor signal v2 occurs delayed by the first time distance $\Delta T1'$ in relation to the first sensor signal v1. It is realized that in this case the first measurement signal SME1 will comprise the first sensor signal v1 and, delayed by twice the first time distance and with reversed polarity, the second sensor signal v2. The second measurement signal SME2 will comprise the second sensor signal v2 and, delayed by the first time distance and with reversed polarity, the first sensor signal v1, these two signals thus essentially cancelling each other. The output signal SRES1 from the resonant RESD1 will thus have a variation as illustrated in FIG. 6E whereas the output signal SRES2 from the resonant circuit RESD2, as illustrated in FIG. 6F, remains essentially zero. The product signal SP thus remains zero in this case.

Figure 2C:
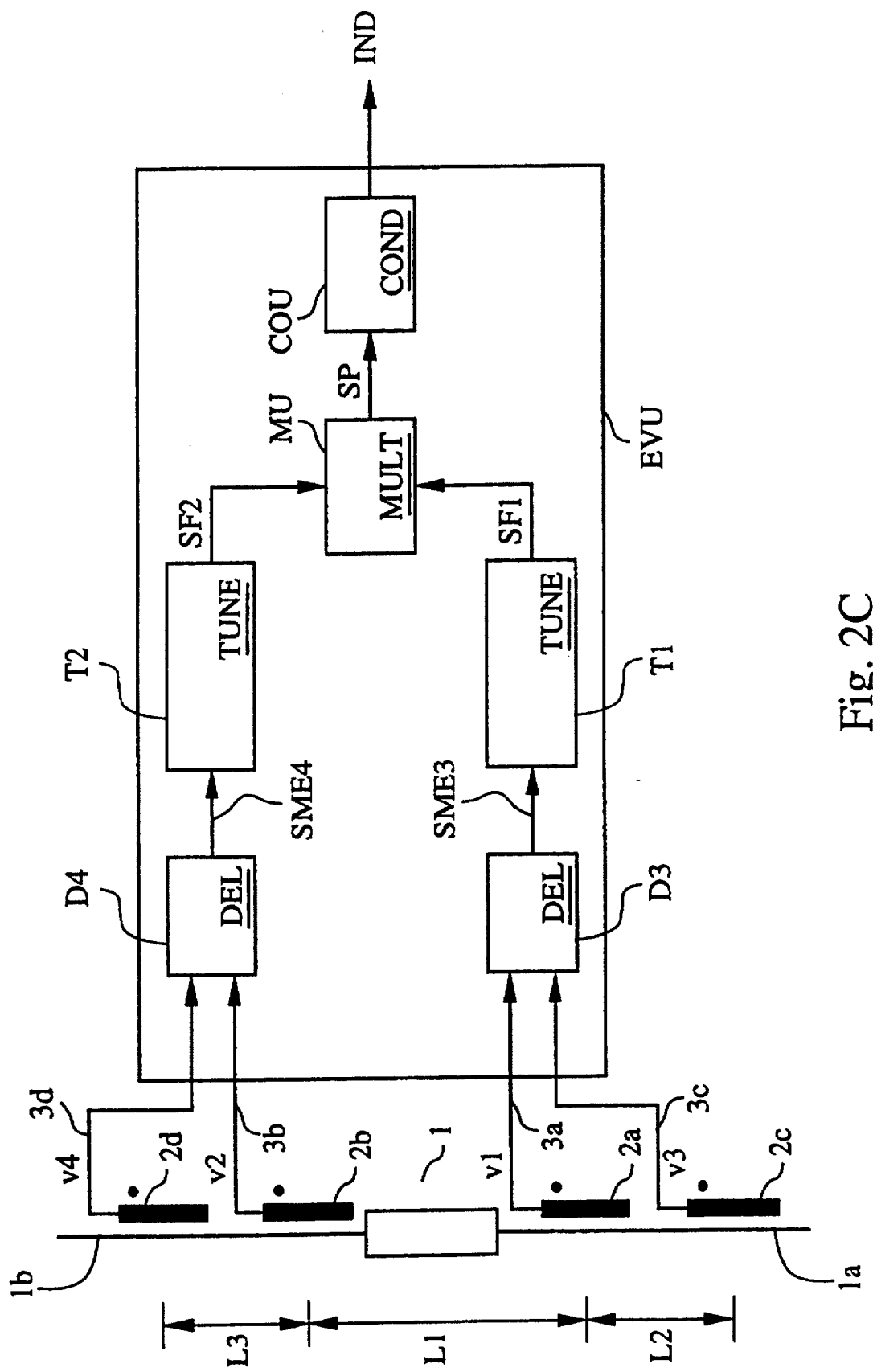

An additional embodiment of the invention, which is advantageous with respect to suppression of external disturbances, is shown in FIG. 2C. The device comprises in this embodiment a third and a fourth sensor 2$c$, 2$d$, respectively, of the same kind as the first and second one, whereby the third sensor 2$c$ is placed at the same connection lead as the first sensor and generates a third sensor signal v3 and the fourth sensor 2$d$ is placed at the same connection lead as the second sensor and generates a fourth sensor signal v4. The first and second sensors are located at a first mutual distance L1, the first and third sensors are located at a second mutual distance L2, and the second and fourth sensors are located at a third mutual distance L3. By analogy with what has been described above, the second and third distances, respectively, correspond to a second time distance $\Delta T2'$ and a third time distance $\Delta T3'$, respectively, for sensor signals generated in dependence on a current pulse which passes through the test object via its connection leads.

Figure 1B:
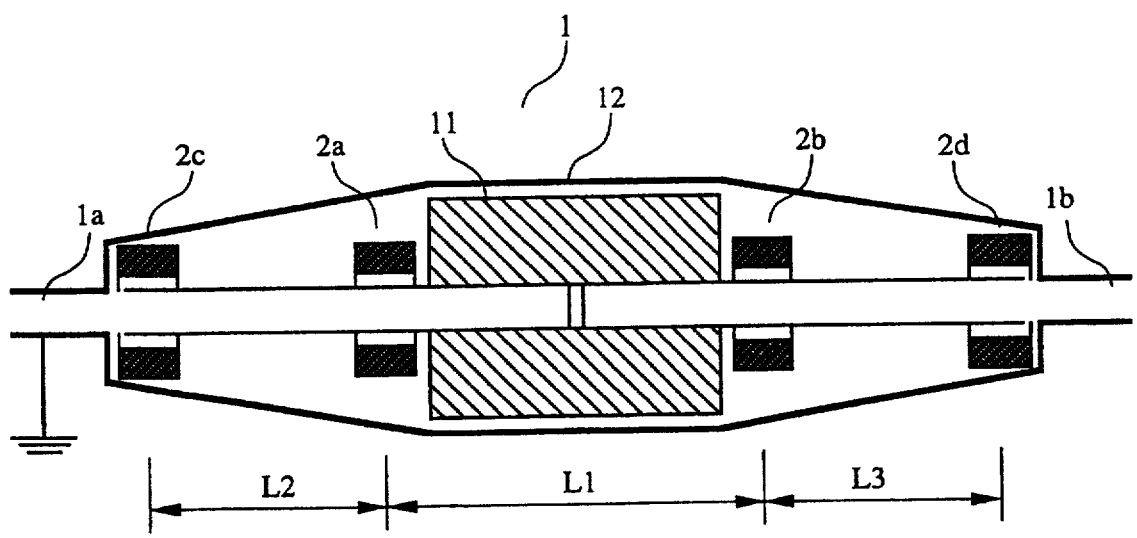

FIG. 1B illustrates the physical location of sensors at cable joints of the same kind as described with reference to FIG. 1A. Since the test object consists of a cable joint, the distance L1 may typically be of the order of magnitude of 1 or 2 meters and the distances L2 and L3 of the order of magnitude of 1 meter. Usually, the second time distance $\Delta T2'$ is practically equal to the third time distance $\Delta T3'$.

All the four sensor signals are supplied to the evaluation equipment EVU (FIG. 2C), the third sensor signal via a two-wire sensor cable 3$c$ and the fourth sensor signal via a two-wire sensor cable 3$d$. The evaluation equipment comprises in this case, in addition to the tuning units T1, T2 described above, the multiplying member MU and the signal-processing unit COU, a third delay unit D3 associated with the first and third sensors, and a fourth delay unit D4 associated with the second and fourth sensors. The third delay unit is supplied with the first and third sensor signals and forms, in dependence thereon, a third measurement signal SME3. The fourth delay unit is supplied with the second and fourth sensor signals and forms, in dependence thereon, a fourth measurement signal SME4. The first tuning unit is supplied with the third measurement signal and forms the first filter signal in dependence thereon and the second tuning unit is supplied with the fourth measurement signal and forms the second filter signal in dependence thereon.

Figure 3C:
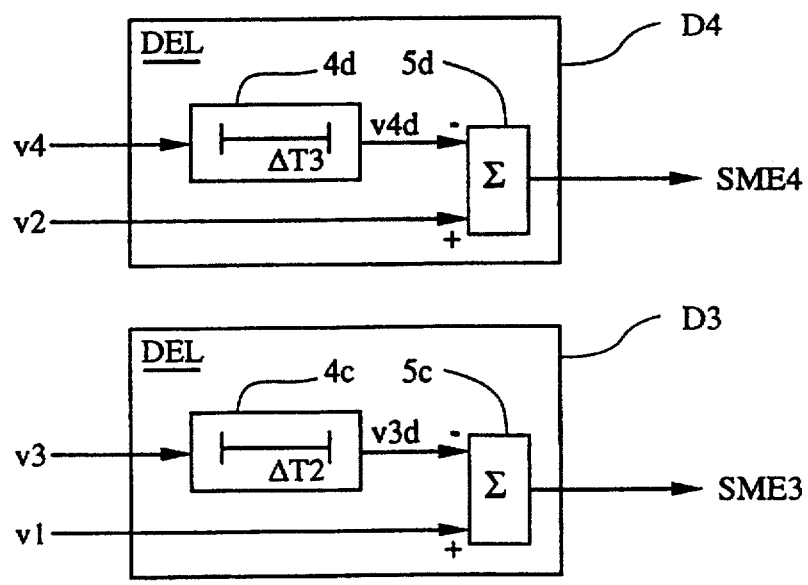

FIG. 3C shows an embodiment of the third and fourth delay units. The third delay unit comprises a delay member 4$c$, which is supplied with the third sensor signal and which, as output signal, forms a third delayed sensor signal v3$d$, which corresponds to the third sensor signal but delayed by an optional second time delay $\Delta T2$, preferably chosen equal to the above-mentioned second time distance $\Delta T2'$. The third delay unit further comprises a difference-forming member 5$c$, which is supplied with the first sensor signal v1 and the third delayed sensor signal and which, in dependence thereon, forms the third measurement signal as the difference of the first sensor signal and the third delayed sensor signal.

The fourth delay unit comprises a delay member 4$d$, which is supplied with the fourth sensor signal and which, as output signal, forms a fourth delayed sensor signal v4$d$, which corresponds to the fourth sensor signal but delayed by an optional third time delay $\Delta T3$, preferably chosen equal to the above-mentioned third time distance $\Delta T3'$. The fourth delay unit further comprises a difference-forming member 5$d$, which is supplied with the second sensor signal v2 and the fourth delayed sensor signal and which, in dependence thereon, forms the fourth measurement signal as the difference of the second sensor signal and the fourth delayed sensor signal.

The tuning units T1 and T2 may in this embodiment be of the kind as described above with reference to FIG. 3A, however with the difference that the resonant circuits and the bandpass-filtering members in this case are tuned to parallel resonance at, or comprise in their passband, angular frequencies ($\omega 2$ and $\omega 3$, related to the second time distance $\Delta T2'$ and the third time distance $\Delta T3'$, preferably chosen such that ($\omega 2 = 2\pi/4\Delta T2'$ and $\omega 3 = 2\pi/4\Delta T3'$.

Typically, in this embodiment of the invention, the angular frequencies ($\omega 2$ and ($\omega 3$ may correspond to frequencies in the interval 10 to 100 MHz.

Figure 7A:
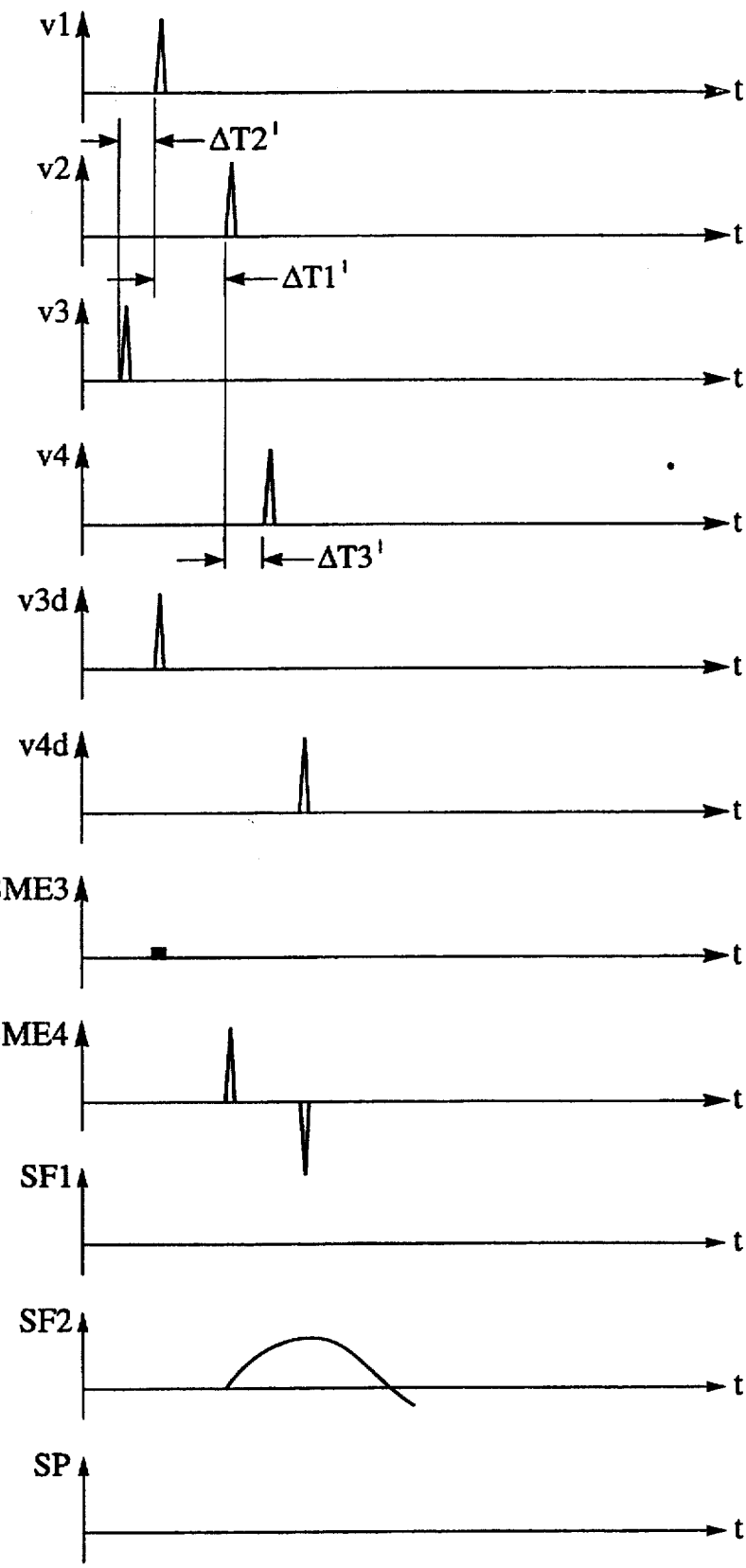
Figure 7B:
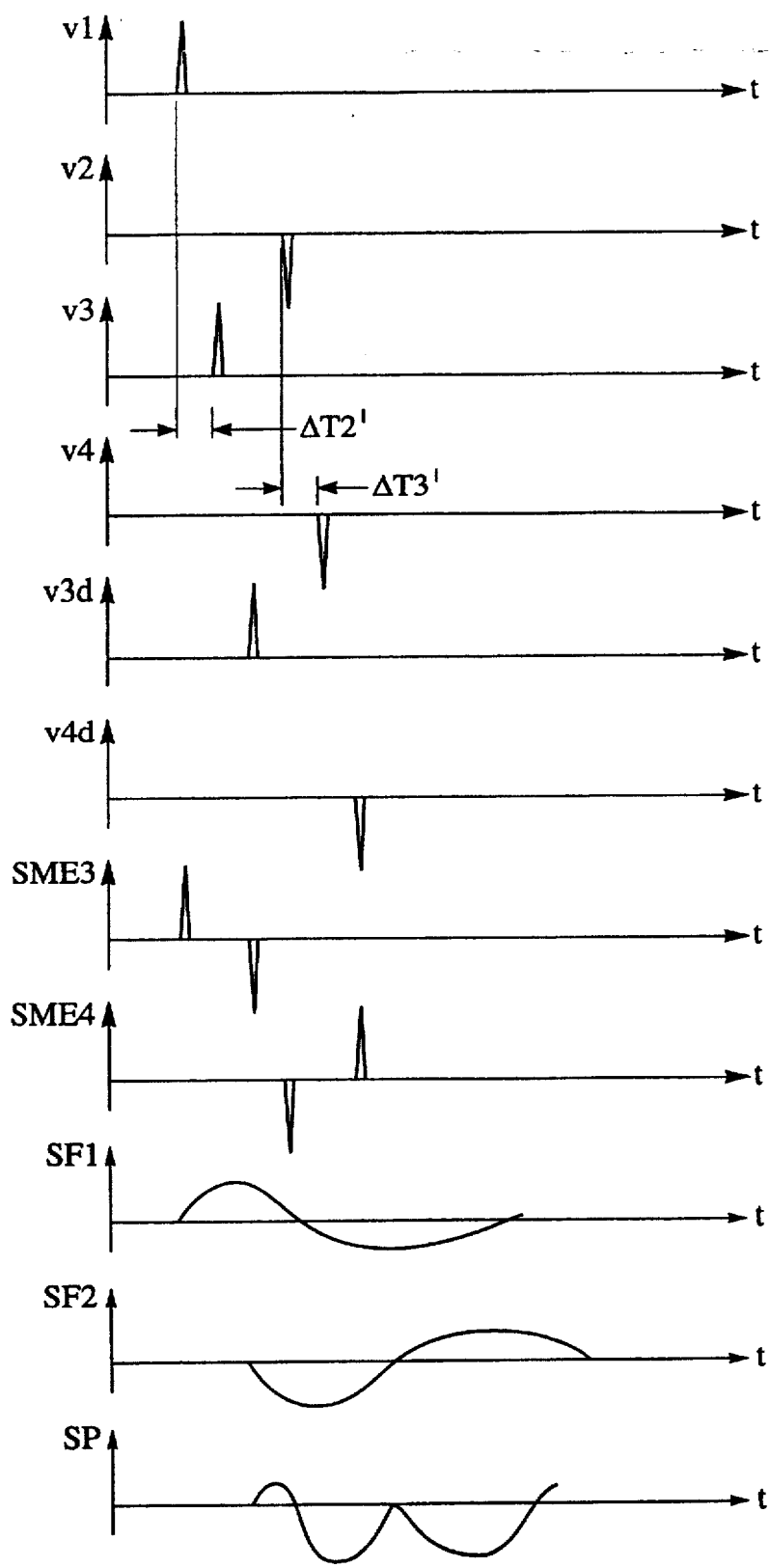

FIGS. 7A and 7B show on the vertical axis, sequentially from top to bottom on the respective axes, schematically the fundamental appearance of signal shapes for the abovementioned sensor signals v1, v2, v3 and v4, the delayed sensor signals v3$d$ and v4$d$, the measurement signals SME3, SME4, the filter signals SF1 and SF2, and the product signal SP, as a function of time, shown along the horizontal axis.

FIG. 7A relates to the case where an external disturbance, for example a partial discharge in an installation component connected to the test object, passes therethrough. FIG. 7B relates to the case where a partial discharge occurs in the test object between the sensors. Further, it is assumed that the second time delay ΔT2 is chosen equal to the second time distance ΔT2' and the third time delay ΔT3 is chosen equal to the third time distance ΔT3'.

In the example illustrated in FIG. 7A, where the external disturbance is assumed to first pass through the third sensor, the third measurement signal SME3 is extinguished by difference formation in the third delay unit. In the event that the externally entering disturbance first passes through the fourth sensor, the fourth measurement signal SME4 is extinguished by difference formation in the fourth delay unit. Therefore, either the second or the first filter signal and hence the product signal remain zero or at least near zero.

In the example illustrated in FIG. 7B, each one of the measurement signals will contain two pulses of opposite polarity and of a shape similar to that of the sensor signals. The fundamental frequency of the measurement signal will thus lie in the frequency range which corresponds to the resonant frequency of the respective resonant circuits and the passband of the bandpass-filtering members, which gives rise to a first and a second filter signal of the resonant frequency mentioned. The product signal is thus given a pulsating variation, the appearance of which, that is, its phase position and mean value, depend of where within the test object the internal discharge occurs. A mean value of the product signal, formed in some manner known per se, may thus provide information about the position of the discharge. The product signal is supplied to the signal-processing unit in the manner described above.

Figure 4A:
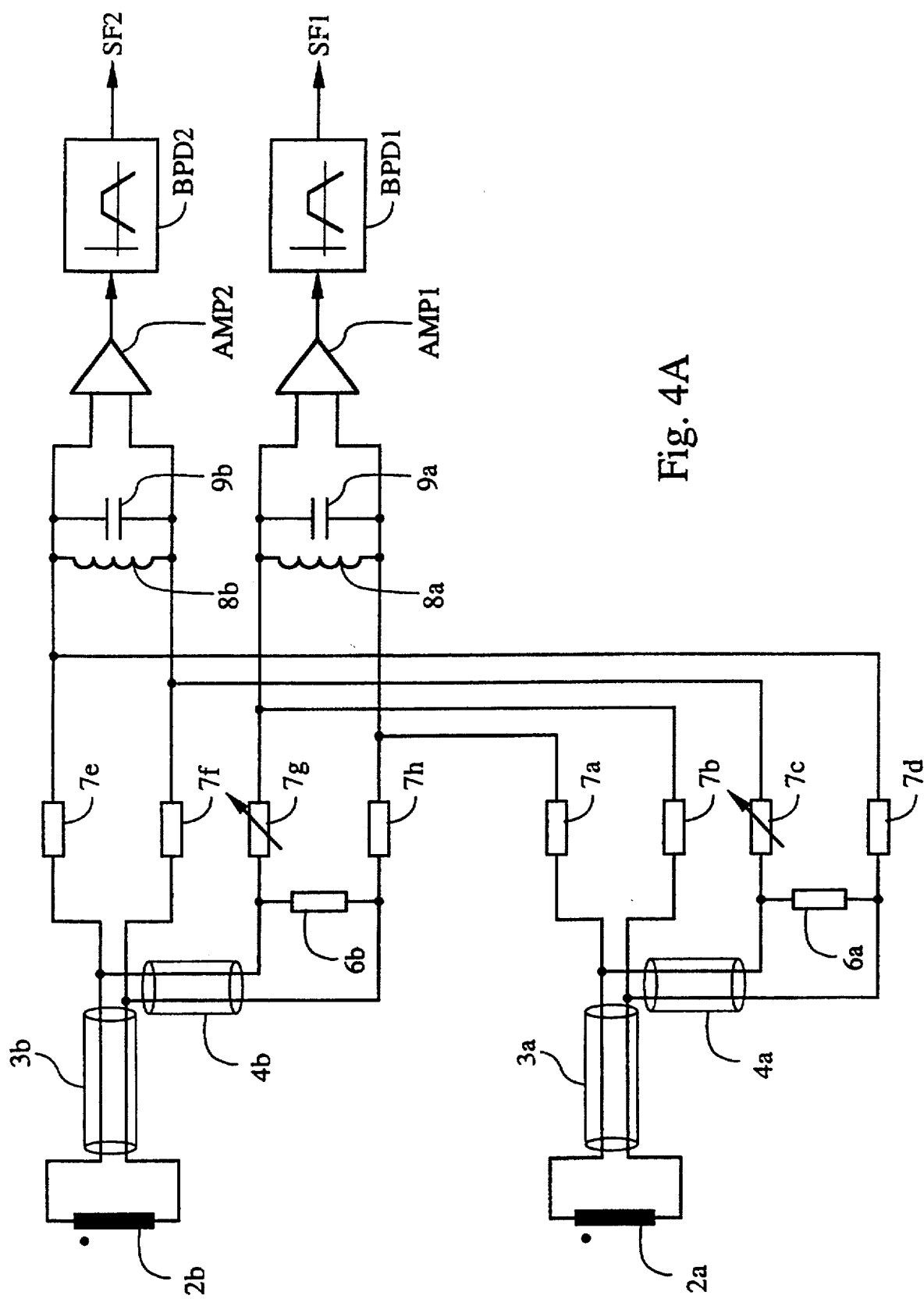

FIG. 4A illustrates schematically parts of a circuit diagram for an embodiment of the invention according to the above-described FIGS. 2B, 3A and 3B. The first sensor v1 is connected to the input terminals of the amplification member AMP1 by means of a two-wire shielded sensor cable 3a via resistors 7a, 7b, the output signal of the member AMP1 being supplied to the bandpass-filtering member BPD1. The second sensor v2 is connected in an analogous manner to the input terminals of the amplification member AMP2 by means of a two-wire shielded sensor cable 3b via resistors 7e, 7f, the output signal of the member AMP2 being supplied to the bandpass-filtering member BPD2. The sensor cables have a characteristic impedance Z and between the two wires in the respective sensor cable, impedance elements 6a, 6b, respectively, are arranged, with the impedance Z for thus achieving a reflection-free connection of the sensor cables. In this way, at least under ideal conditions, the circuits connected to the sensor cables, as viewed from the respective sensor, will exhibit a purely resistive impedance. Across the input terminals of the respective amplification member there is connected a parallel resonant circuit, comprising an inductance coil 8a and a capacitor 9a and 8b, 9b, respectively, corresponding to the resonant circuit RESD described with reference to FIG. 3B, and chosen such that the resonance conditions described above are fulfilled. A delay cable 4a is connected to the sensor cable 3a, this delay cable being of the same kind as the sensor cable and with a length adapted to give the time delay ΔT1 mentioned with reference to FIG. 3C. The difference formation in the difference-forming member 5a described with reference to FIG. 3C is achieved, in this embodiment, by connecting the delay cable 4a via resistors 7c, 7d to the input terminals of the amplification member AMP2. In analogous manner, a delay cable 4b is connected to the sensor cable 3b, this delay cable being connected via resistors 7g, 7h to the input terminals of the amplification member AMP1. The resistors 7a–7h are suitably chosen with resistance values much greater than the impedance values for the impedance elements 6a, 6b, and the resistors 7c and 7g may be advantageously designed adjustable for adaptation to the manufacturing tolerances of the sensors.

Figure 4B:
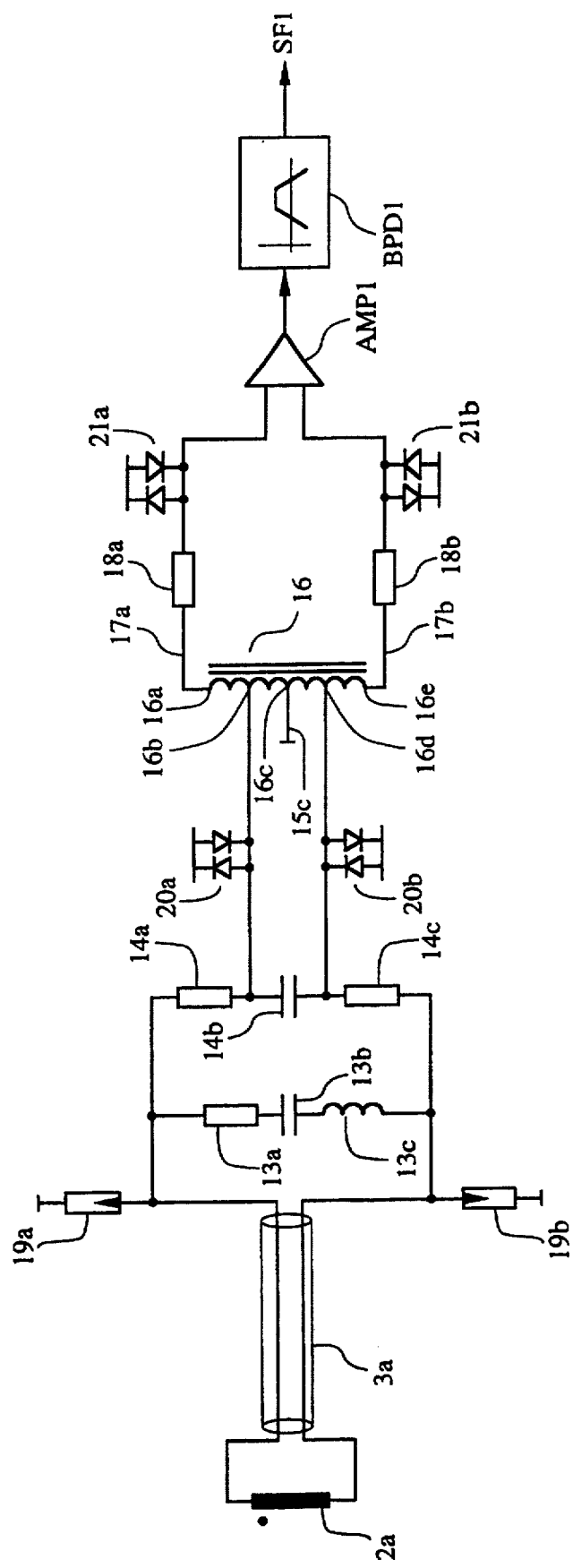

FIG. 4B illustrates schematically parts of a circuit diagram for an embodiment according to the invention of the impedance matching member IMPD, the bandpass-filtering member BPD1 and the amplification member AMP1, which members are comprised in a tuning circuit according to FIG. 3A. The sensor 2a is connected via the sensor cable 3a to a series-resonance circuit, connected between the two wires of the cable and comprising a resistor 13a, a capacitor 13b and an inductance coil 13c. In similar manner, there are connected between the two wires of the cable a series connection of a resistor 14a, a capacitor 14b and an additional resistor 14c. The two terminals of the capacitor 14b are each connected, via respective electric conductors 15a, 15b, to respective taps 16b, 16d, respectively, on an inductance coil 16 with a magnetic core. The inductance coil 16 has terminals 16a and 16e and a centre tap 16c, which is connected via a conductor 15c to a signal zero common to the tuning unit. Between the terminal 16a and the tap 16b, n2 turns of the winding of the coil are arranged, between the taps 16b and 16c n1 turns are arranged, between the taps 16c and 16d n1 turns are arranged, and between the tap 16d and the terminal 16e n2 turns of the winding of the coil are arranged. The terminals 16a and 16e are each connected, with respective conductors 17a, 17b, respectively, via resistors 18a, 18b to the input terminals of the amplification member AMP1. The resistor 13a has an impedance z equal to the characteristic impedance of the sensor cable whereas the impedance elements 14a and 14c each have an impedance equal to Z/2. The inductance coil 16 exhibits, between the taps 16b and 16d, an inductance L2 and forms together with the capacitor 14b a parallel resonant circuit, which is tuned to give the bandpass-filtering member a passband according to the conditions described above. The series-resonance circuit formed of the impedance element 13a, the capacitor 13b and the inductance coil 13c is tuned to provide, in cooperation with the parallel-resonance circuit mentioned, a constant impedance across the frequency range relevant to the sensing.

In an embodiment as described with reference to FIG. 4B, the passband for the frequency range of interest to the test object during the testing becomes independent of tolerances and variations in the inductance ofd the sensor and of the length of the sensor cable. In addition thereto, the inductance coil 16 provides a noise-free preamplification of the sensor signal in the speed ratio n2/n1, typically of the order of magnitude of five times.

To protect components included in the tuning unit against overvoltages, gas discharge tubes 19a, 19b are connected between the respective wires of the sensor cable and the ground plane and diode groups 20a, 20b, 21a, 21b, each comprising two diodes in anti-parallel connection, connected between the signal zero and the respective conductors 15a, 15b and the input terminals of the amplification member.

The invention is not limited to the embodiments shown but a plurality of modifications are feasible within the scope of the inventive concept. The device comprises logic circuits and time-delay circuits, shown in the figures in the form of block diagrams, which may be completely or partially designed as analog or digital electric circuits or consist of program functions, for example in micro-processors programmed for the purpose. In this context, it is to be understood that the input and output signals to the respective circuits may consist of electric/logic signals or of calculating values.

Also the delay members described with reference to FIGS. 3B and 3C may advantageously be designed as cables of the same or a similar kind as the sensor cable, adapted to a suitable length.

The inductance coil 16 described with reference to FIG. 4B may be designed without a magnetic core.

The relation between the tuning frequencies ω2 and ω3 and the second and third time distances, respectively, described with reference to the embodiment according to FIG. 2C, is chosen to achieve the greatest sensitivity of the sensing device. In principle, tuning frequencies three times, five times, seven times, etc., higher than the ratio mentioned may also provide a satisfactory sensitivity.

The sensors may also be based on other principles, known per se, which provide a directionally sensitive sensing of the magnetic field generated by the current pulses, for example comprising Hall elements, magnetoresistive elements or superconducting elements, so-called SQUIDs.

What is claimed is:

1. A device for sensing partial discharges in a test object (1) with two electric connection conductors (1a, 1b, 1c, 1d), having evaluation equipment (EVU), and at least one first and one second sensor (2a, 2b, 2c, 2d), each one for direction-sensitive sensing of current pulses through a respective one of the connection conductors by sensing a magnetic field generated by the current pulses, said sensors generating and supplying to the evaluation equipment sensor signals in dependence on said current pulses and their direction, the first sensor a first sensor signal (v1), and the second sensor a second sensor signal (v2), whereby the first and second sensors are located at a first mutual distance (L1), corresponding to a first time distance ($\Delta T1'$) for sensor signals originating from a current pulse which passes through the test object, whereby the evaluation equipment in dependence on received sensor signals generates an indication signal (IND), indicating a partial discharge in the test object, when the sensors sense current pulses which flow either in a direction away from the test object through the two connection conductors, or in a direction towards the test object through the two connection conductors, wherein the evaluation equipment comprises a first tuning unit (T1) associated with the first sensor, and a second tuning unit (T2) associated with the second sensor, each unit, in dependence on the respective sensor signal, forming a first filter signal (SF1) and a second filter signal (SF2), respectively, each one periodically oscillating with a preselected period time (TP) longer than the first time distance, and a multiplying means (MU), which is supplied with, and in dependence on said first and second filter signals, for forming a product signal (SP), and wherein the evaluation equipment forms the indication signal in dependence on the product signal.

2. A device according to claim 1, wherein each one of the tuning units comprises a resonant circuit (RESD1, RESD2), tuned to resonance at an angular frequency corresponding to said period time, said resonant circuits having a decay time (TD) corresponding to at least two periods of the preselected time (TP) and whereby each one of the resonant circuits is supplied with a signal formed in dependence on the respective sensor signal and each one of the tuning units forms the respective filter signal in dependence on an output signal from the respective resonant circuit.

3. A device according to claim 1, characterized in that each one of the tuning circuits comprises a bandpass-filtering member (BPD1, BPD2) with a passband which comprises an angular frequency corresponding to said period time and with a bandwidth corresponding to said decay time, whereby each of said bandpass-filtering members is supplied with a signal formed in dependence on the respective sensor signal and each of the tuning circuits forms the respective filter signal in dependence on an output signal from the respective bandpass-filtering member.

4. A device according to claim 1, wherein the respective sensor signal is transmitted to the evaluation equipment via a transmission line (3a, 3b, 3c, 3d) associated with each one of the sensors, characterized in that it comprises means (IMPD, 6a, 6b) connected to the respective transmission line and terminating this with an impedance which is at least approximately equal to the characteristic impedance (Z) of this transmission line.

5. A device according to claim 1, characterized in that the evaluation equipment comprises a first delay unit (D1) associated with the first sensor and a second delay unit (D2) associated with the second sensor, whereby the first delay unit forms a first measurement signal (SME1) in dependence on a difference of the first sensor signal and the second sensor signal, delayed by a selectable first time delay ($\Delta T1$), and the second delay unit forms a second measurement signal (SME2) in dependence on a difference of the second sensor signal and the first sensor signal, delayed by the first time delay, and that the first tuning unit is supplied with the first measurement signal and forms the first filter signal in dependence thereon and that the second tuning unit is supplied with the second measurement signal and forms the second filter signal in dependence thereon.

6. A device according to claim 1, characterized in that the first and second tuning units form the first and second filter signals, respectively, oscillating with a period corresponding to a frequency located in an interval of 10 kHz to 10 MHz.

7. A device according to claim 1, wherein the device comprises a third and a fourth sensor (2c, 2d, respectively) for direction-sensitive sensing of current pulses through the respective connection conductor, the third sensor at the same connection conductor as the first sensor, generating and supplying to the evaluation equipment a third sensor signal (v3), and the fourth sensor at the same connection conductor as the second sensor, generating and supplying to the evaluation equipment a fourth sensor signal (v4), whereby the first and third sensors are located at a second mutual distance (L2), corresponding to a second time distance ($\Delta T2'$) for sensor signals originating from a current pulse which passes through the test object, and the second and fourth sensors are located at a third mutual distance (L3), corresponding to a third time distance ($\Delta T3'$) for sensor signals originating from a current pulse which passes through the test object, wherein the evaluation equipment comprises a third delay unit (D3) associated with the third sensor, and a fourth delay unit (D4) associated with the fourth-sensor, the third delay unit forms a third measurement signal (SME3) in dependence on a difference of the first sensor signal and the third sensor signal, delayed by an optional second time delay ($\Delta T2$), and the fourth delay unit forms a fourth measurement signal (SME4) in dependence on a difference of the second sensor signal and the fourth sensor signal, delayed by an optional third time delay ($\Delta T3$), the first tuning unit is supplied with the third measurement signal and forms the first filter signal in dependence thereon, and the second tuning unit is supplied with the fourth measurement signal and forms the second filter signal in dependence thereon.

8. A device according to claim 7, wherein the time distance is at least approximately equal to the third time distance, characterized in that the first and second tuning units form the first and second filter signals, respectively, oscillating with a period time four times longer than the second time distance.

9. A device according to claim 5, characterized in that said delay units consist of a cable (4a, 4b).

10. A device according to claim 1, characterized in that each of the tuning units comprises a series-resonance circuit (13a, 13b, 13c) connected in parallel with a parallel-resonance circuit (14b, 16), which are supplied with the respective sensor signal, and are tuned to exhibit towards this a constant impedance across a frequency range relevant to the sensing.

11. A device according to claim 1, characterized in that each of the sensors mentioned comprises at least one Rogowski coil (2a, 2b, 2c) arranged around a connection conductor.

* * * * *